US007635972B2

(12) United States Patent
Rowe

(10) Patent No.: US 7,635,972 B2
(45) Date of Patent: Dec. 22, 2009

(54) RECHARGEABLE POWERING SYSTEM IN AN ELECTRICITY METER

(76) Inventor: Paul Rowe, 12 Mill Lane, Trimley St. Martin, Felixstowe, Suffolk IP11 ORN/GB (GB)

( * ) Notice: Subject to any disclaimer, the term of this patent is extended or adjusted under 35 U.S.C. 154(b) by 150 days.

(21) Appl. No.: 11/235,702

(22) Filed: Sep. 26, 2005

(65) Prior Publication Data

US 2006/0103368 A1    May 18, 2006

(30) Foreign Application Priority Data

Oct. 6, 2004   (GB)   .................... 0422215.4

(51) Int. Cl.
  *G01R 11/32*   (2006.01)
(52) U.S. Cl. ..................................... 324/142
(58) Field of Classification Search .............. 324/107, 324/142, 765, 158.1, 127, 126; 340/870.02, 340/870.03; 702/60, 64, 142, 130
  See application file for complete search history.

(56) References Cited

U.S. PATENT DOCUMENTS

| 4,301,508 | A | | 11/1981 | Anderson et al. ............ 702/58 |
|---|---|---|---|---|
| 4,639,728 | A | | 1/1987 | Swanson ............... 340/870.03 |
| 4,701,858 | A | | 10/1987 | Stokes et al. ................ 364/483 |
| 4,794,327 | A | * | 12/1988 | Fernandes ................... 324/126 |
| 5,659,300 | A | * | 8/1997 | Dresselhuys et al. ... 340/870.02 |
| 6,229,295 | B1 | * | 5/2001 | Hemminger et al. ........ 324/142 |
| 6,369,719 | B1 | * | 4/2002 | Tracy et al. ............ 340/870.02 |
| 6,665,620 | B1 | | 12/2003 | Burns et al. .................... 702/62 |
| 6,687,627 | B1 | | 2/2004 | Gunn et al. .................... 702/61 |

FOREIGN PATENT DOCUMENTS

GB      2326002 A      9/1998

OTHER PUBLICATIONS

Search Report- Feb. 4, 2005.

* cited by examiner

*Primary Examiner*—Ha Tran T Nguyen
*Assistant Examiner*—Tung X Nguyen
(74) *Attorney, Agent, or Firm*—Sofer & Haroun, LLP

(57) ABSTRACT

A polyphase electricity meter comprising a metering system allowing to measure a flow of electricity through a plurality of phases of a portion of an electricity network. The electricity meter further comprises a rechargeable powering system allowing to power at least the metering system. The rechargeable powering system is charged by at least one phase of the electricity network.

4 Claims, 1 Drawing Sheet

(connectors)

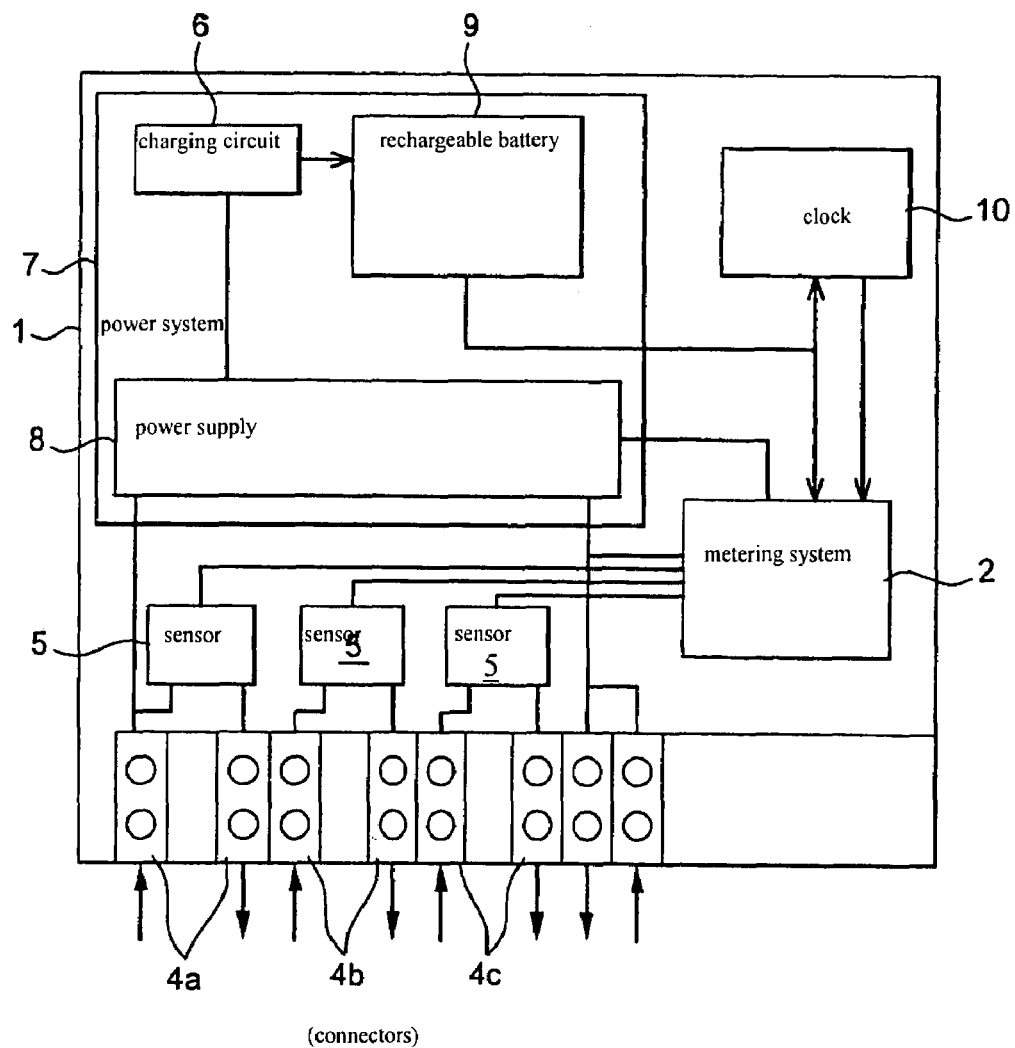
Figure unique

RECHARGEABLE POWERING SYSTEM IN AN ELECTRICITY METER

RELATED APPLICATION

This application is related to and claims the benefit of priority from United Kingdom Patent Application No. 0422215.4, filed on Oct. 6, 2004, the entirety of which is incorporated herein by reference.

FIELD OF THE INVENTION

The present invention relates to the field of electricity meters.

BACKGROUND

The electricity meters are used to measure a flow of electricity through a portion of an electricity network.

For example, an electricity meter may be used, in combination with a transformer and a converter, to measure a flow of electricity generated by a power station.

Furthermore, electricity meters, alone or in combination with a transformer and a converter, may also allow to measure the flow of electricity furnished by the electricity network to a consumption unit, e.g. a house, or a factory.

The electricity meters comprise a metering system powered by a powering system. The powering system allows to convert energy of the electricity network into a powering voltage.

The powering system is connected to the electricity network. If a blackout occurs, i.e. the electricity network no longer carries electricity to the consumption unit, or the power station stops generating electricity, the powering system inside the electricity meter is no longer supplied. The metering system is subsequently not powered either. However, since the flow of electricity to be measured is null during a blackout, the measurement of the electricity used up by the consumption unit, or generated at the power station, remains substantially correct.

The electricity meters may also comprise a clock and a non-rechargeable battery allowing to supply the clock in case a blackout occurs.

The power stations typically generate electricity as three phases and the electricity network may carry electricity from the power stations to the consumption units as three phases. However, the electricity network also furnishes electricity as a single phase to some consumption units, typically private houses. Some private houses are supplied by a three phases electricity network.

The electricity meters may hence comprise a single phase electricity meter allowing to measure the flow of electricity through a single phase, or a polyphase electricity meter allowing to measure the flow of electricity through a plurality of phases of the electricity network.

The current regulation requires that the polyphase electricity meters remain available during a predetermined lapse of time when the electricity network is partially disabled, i.e. a power failure occurs with one or two phases of a three phases electricity network.

The powering system of the polyphase electricity meters is hence connected to the three phases of the electricity network, since any one of the phases may be lost. The powering system has to be able to adapt to a loss of any one of the phases of the electricity network and is relatively complex.

There is a need for an electricity meter in which the metering system remains available when a power failure occurs in one or two phases if any of the electricity network.

OBJECTS AND SUMMARY

The present invention provides a polyphase electricity meter, comprising a metering system allowing to measure a flow of electricity through a plurality of phases of a portion of an electricity network, characterized in that the electricity meter further comprises a rechargeable powering system allowing to power at least the metering system, the rechargeable powering system being charged by at least one phase of the electricity network.

If the at least one phase of the electricity network on which the rechargeable powering system is charged is lost, the metering system remains powered for a lapse of time, the lapse of time corresponding to the capacity of the rechargeable powering system. The energy stored into the rechargeable powering system allows to power the metering system, thus complying with the requirements of the current regulation.

The rechargeable powering system may be charged by a single phase of the electricity network.

Alternatively, the rechargeable powering system may charged by a plurality of phases of the electricity network, e.g. three phases of the electricity network.

The metering system advantageously allows to measure the flow of electricity through three phases of the portion of the electricity network. Such a polyphase electricity meter is commonly used, since electricity is typically generated and carried as three phases.

The polyphase electricity meter may be used in combination with a transformer and a converter, for example at an output of a power station, so as to measure the flow of electricity generated at the power station. The polyphase electricity meter may also be used, whether alone or in combination with a transformer and a converter, to measure a flow of electricity furnished to a three phases consumption unit, e.g. a factory, a building, or a private house.

If the three phases electricity network is partially disabled, i.e. one or two phases are lost, the rechargeable powering system goes on powering the metering system at least for the lapse of time. As previously explained, if the at least one phase on which the rechargeable powering system is charged is lost, the metering system remains powered from the energy stored into the rechargeable powering system. If the one or two lost phases are not connected to the rechargeable powering system, the metering system remains powered, without even discharging the rechargeable powering system.

Furthermore, in case the three phases of the electricity network are lost, the metering system of the electricity meter of the present invention remains powered during the lapse of time corresponding to the capacity of the non-rechargeable powering system.

Alternatively, the metering system allows to measure the flow of electricity through a single phase of the portion of the electricity network.

The single-phase electricity meter may typically be used for measuring the flow of electricity furnished to a small consumption unit supplied by a single-phase electricity network, e.g. private houses.

If the single phase is lost, the rechargeable powering system is no longer charged. The metering system of such a single phase electricity meter remains powered for the lapse of time, from the energy stored into the rechargeable powering system.

The rechargeable powering system may also allow to power further systems of the electricity meter, such as a clock, a display unit or an alarm unit.

The electricity meters from the prior art comprising a clock and a non-rechargeable battery are no longer able to power the clock when the energy of the non-rechargeable battery is spent. Since an electricity meter is typically designed to last several decades, the non-rechargeable battery may be discharged before the electricity meter be replaced.

The electricity meter of the present invention allows to power the clock whatever the number and the duration of power failures, provided that the power failures have durations short enough so as to avoid discharging the rechargeable powering system in a single power failure.

The rechargeable powering system may comprise a rechargeable battery, or a super capacitor.

Such rechargeable powering systems are relatively easy to implement into an electricity meter. However, the scope of the present invention is not limited by the nature of the rechargeable powering system or by the nature of the elements of the rechargeable powering system.

BRIEF DESCRIPTION OF THE DRAWINGS

Other characteristics and advantages of the invention will appear reading the following description of an embodiment of the invention, given by way of example and with reference to the accompanying drawing, in which:

FIG. 1 schematically illustrates an example of an electricity meter according to a preferred embodiment of the present invention.

DETAILED DESCRIPTION

The illustrated electricity meter 1 comprises a metering system 2 to measure a flow of electricity through a three phases electricity network (not represented).

A first connector 4a, a second connector 4b and a third connector 4c respectively allow to connect a first phase, a second phase and a third phase of the three phases electricity network to the metering system 2.

Three current sensors 5 are individually connected to the connectors 4a, 4b and 4c. The metering system 2 receives from the currents sensors 5 three signals, each signal depending of the current passing through the associated phase. The metering system 2 allows to process the received signals so as to provide a measurement of the flow of electricity through the three phases electricity network.

The metering system 2 is powered by a rechargeable powering system 7. In the illustrated embodiment, the rechargeable powering system 7 is charged by the first phase of the three phases electricity network.

The rechargeable powering system 7 may for example comprise a power supply 8 and a rechargeable battery 9.

The power supply 8 allows to provide a powering voltage, e.g. 5V, from the energy of the electricity network, as long as the first phase carries sufficient amount of electricity.

The power supply 8 allows to power the metering system 2.

The power supply 8 also allows to charge the rechargeable battery 9 from the energy carried by the first phase. A battery charging circuit 6 allows to ensure a proper charging of the rechargeable battery 9.

If a power failure occurs with the second phase and/or the third phase, the power supply 8 still allows to power the metering system 2 from the energy of the first phase.

If a power failure occurs with the first phase, the rechargeable battery 9 allows to power the metering system 2 for a lapse of time. The lapse of time corresponds to the capacity of the rechargeable battery 9 and depends of the consumption of the metering system 2 and of further systems powered by the rechargeable battery 9 such as a clock 10.

The clock 10 may comprise a crystal oscillator (not represented). The metering system 2 may use a clock signal generated by the crystal oscillator.

The electricity meter 1 may comprise a detection circuit (not represented) that allows to detect a power failure of the first phase and to trigger a discharging of the rechargeable battery 9.

Alternatively, controlling means, e.g. a controller (not represented) of the metering system 2, warns the rechargeable powering system 7 when detecting an abrupt drop of the measured flow of electricity.

The scope of the present invention is not limited by the nature of detecting means to detect of the power failure and by the nature of subsequent triggering means.

The invention claimed is:

1. A polyphase electricity meter comprising:
a metering system allowing to measure a flow of electricity through a plurality of phases of a portion of an electricity network, wherein the electricity meter further includes
a rechargeable powering system having;
a power supply charged by a single phase among a plurality of phases, said power supply powering at least said metering system; and
a rechargeable battery adapted to be recharged by said power supply, wherein said rechargeable battery is adapated to power at least said metering system in case said single phase is lost.

2. The polyphase electricity meter according to claim 1, wherein the metering system allows to measure the flow of electricity through three phases of the portion of the electricity network.

3. The polyphase electricity meter according to claim 1, wherein the metering system allows measuring the flow of electricity through a single phase of the portion of the electricity network.

4. The polyphase electricity meter according to claim 1, wherein the rechargeable powering system includes a supercapacitor.

* * * * *